(12) United States Patent
Hirota et al.

(10) Patent No.: US 6,348,809 B1
(45) Date of Patent: Feb. 19, 2002

(54) MICROSCOPIC CAPACITANCE MEASUREMENT SYSTEM AND PROBING SYSTEM

(75) Inventors: Yoshihiro Hirota, Kyoto; Toshiyuki Matsumoto, Hyogo-ken, both of (JP)

(73) Assignee: Sumitomo Metal Industries Limited, Osaka (JP)

( * ) Notice: Subject to any disclaimer, the term of this patent is extended or adjusted under 35 U.S.C. 154(b) by 0 days.

(21) Appl. No.: 09/371,546

(22) Filed: Aug. 10, 1999

(30) Foreign Application Priority Data

Aug. 11, 1998 (JP) .......................................... 10-226931

(51) Int. Cl.[7] .............................................. G01R 31/26
(52) U.S. Cl. .................................................... 324/765
(58) Field of Search ................................. 324/765, 457, 324/458, 452, 613

(56) References Cited

U.S. PATENT DOCUMENTS 4,797,620 A * 1/1989 Williams ..................... 324/458
5,986,456 A * 11/1999 Yamashita ................... 324/457

FOREIGN PATENT DOCUMENTS

JP     A-61-14578     1/1986

JP     A-9-280806     10/1997

* cited by examiner

*Primary Examiner*—Safet Metjahic
*Assistant Examiner*—Etienne LeRoux
(74) *Attorney, Agent, or Firm*—Barnes & Thornburg

(57) ABSTRACT

There is provided a probing and measurement system for measuring a capacitance value of a capacitance to be measured, by removing any influence made by a parasitic capacitance and a fluctuation thereof within a shield box 11. The probing and measurement system comprises a prober 1, a signal line having one end to be in contact with a sample to be measured, a shield line surrounding the signal line, and a capacitance measurement circuit 6. The capacitance measurement circuit 6 comprises an operational amplifier 61 having an inverting input terminal connected to the other end of the signal line and a non-inverting input terminal connected to the shield line, wherein an imaginary short state exists between the inverting input terminal and the non-inverting input terminal, and wherein a signal having a value corresponding to an electrostatic capacitance of the sample to be measured is outputted when an AC signal is applied to the non-inverting input terminal. Conductive portions of the shield box 11, conductive portions of a stand 13, a surface of the stand which contacts with the sample to be measured, and the shield line are placed at the same electric potential.

8 Claims, 5 Drawing Sheets

MICROSCOPIC CAPACITANCE MEASUREMENT SYSTEM AND PROBING SYSTEM

BACKGROUND OF THE INVENTION

The present invention relates to a microscopic capacitance measurement system capable of measuring a microscopic capacitance value with a high precision of the order of several femtofarads by removing any influence by a floating capacitance.

Figure 1:
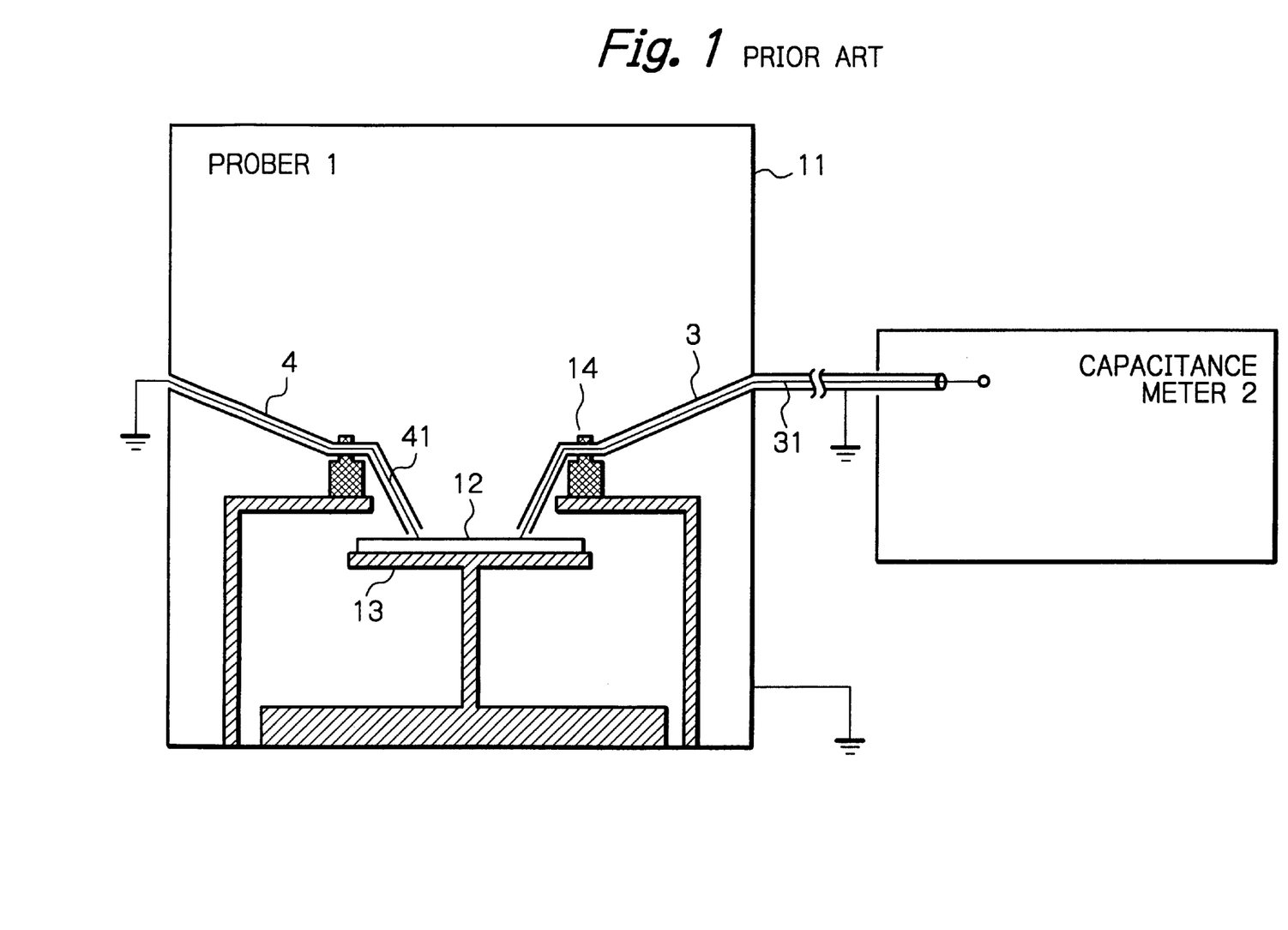
FIG. 1 schematically shows the structure of a conventional capacitance measurement system.

FIG. 1 schematically shows the structure of a conventional capacitance measurement system for measuring a capacitance value of a capacitor formed on a silicon substrate. The measurement system is provided with a prober 1 and a capacitance meter 2. The prober 1 has a grounded shield box 11. In the shield box 11, a grounded stage 13 is provided for mounting a measured sample which forms a capacitor 12 to be measured. A manipulator 14 is disposed on a base surrounding the stage 13, and conductive portions of the manipulator 14 are grounded. Out of coaxial cables 3, 4 having the outer conductors grounded by electrically connecting to the shield box 11, one end of the inner conductor 31 of one the coaxial cables 3 is connected to a measurement electrode which faces the measured sample to form the capacitor 12 to be measured, and the other end of the inner conductor is connected to a detection terminal (input terminal) of the capacitance meter 2. The inner conductor acts as a signal line interconnecting the measurement electrode and the capacitance meter 2. One end of the inner conductor 41 of the other coaxial cable 4 is connected to the measured sample, and the other end thereof is grounded. In this embodiment, the manipulator 14 includes an actuator for adjusting the positions at which one ends of the inner conductors of the coaxial cables 3, 4 contact with the measurement electrode and the measured sample. The prober 1 is also provided with a microscope.

Figure 2:
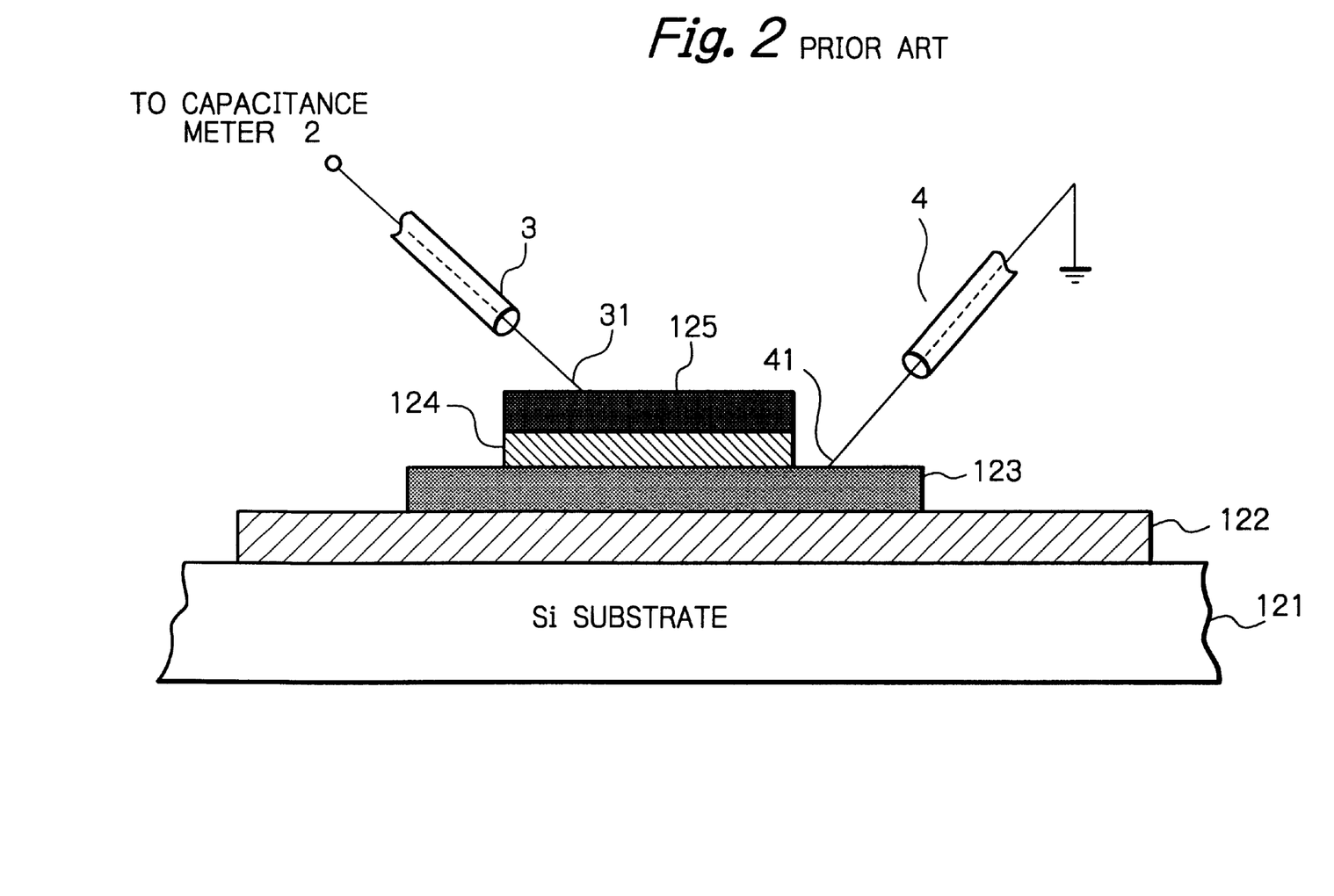
FIG. 2 shows, in an enlarged manner, a capacitor to be measured and the vicinity thereof in the capacitance measurement system of FIG. 1.

FIG. 2 shows in an enlarged manner how one ends of the respective inner conductors of the coaxial cables 3, 4 are in contact with the measurement electrode and the measured sample. On one surface of a silicon substrate 121, the sample to be measured is provided as a first layer electrode 123 via a field oxide film 122, and a second layer electrode 125 is disposed on the first layer electrode 123 via a capacitive insulating film 124, thereby forming the measured capacitor 12 between the first layer electrode 123 and the second layer electrode 125. A back surface of the silicon substrate 121, i.e., a surface which comes in contact with the stage 13 is grounded. During the measurement, one end of the inner conductor 31 of the coaxial cable 3 contacts with the second layer electrode 125, and one end of the inner conductor 41 of the coaxial cable 4 contacts with the first layer electrode 123.

SUMMARY OF THE INVENTION

Since a conventional capacitance measurement system is constituted such as described above, floating capacitances are formed between the shield box 11 and the conductive portions in the prober 1, between the shield box 11 and the conductive portions of the manipulator 14, between the shield box 11 and the stage 13, between the stage 13 and the back surface of the silicon substrate 121, and the like. Therefore, a total value of these floating capacitances is added to a capacitance value of the measured capacitor. In order to avoid an erroneous measurement caused by the presence of such floating capacitance in the prior art, the output of the capacitance meter 2 when one end of the inner conductor 31 or 41 does not contact with the second layer electrode 125 is beforehand obtained as an error value, and this error value is subtracted from actually measured capacitance values thereby correcting the measurement values.

However, such a floating capacitance is changed greatly (e.g., on the order of several hundreds of femtofarads) by various factors such as:

how extent the coaxial cables 3, 4 are folded;

how extent the dielectric constant of the insulating layer within each of the coaxial cables 3, 4 changes with temperature;

a mutual positional relationship among conductive portions of the coaxial cables, the manipulator 14 and the like in the shield box 11;

how extent the dielectric constant of the air within the shield box 11 fluctuates with temperature; and a movement of measuring persons.

As a result, a capacitance of about several tens of picofarads is an upper limit to be measured by the conventional capacity measurement system, and it is impossible to measure a microscopic capacitance of several tens of famtofarads or less.

The present invention has been proposed to solve the problems above-described, and an object of the invention is to provide a probing and measurement system capable of providing a highly precise measurement value by almost removing any influence of a parasitic capacitance.

To achieve the above-mentioned object, the present invention provides a probing and measurement system comprising:

a prober having a box in which a sample to be measured is disposed, and which comprises a signal line having one end which is a detection terminal for contacting with said sample to be measured, and a shield line surrounding said signal line;

device for placing at least one of a conductive portion of said box or a predetermined conductive portion of said sample to be measured and said shield line at the same electric potential; and a capacitance measurement circuit comprising an operational amplifier which has an inverting input terminal connected to the other end of said signal line and a non-inverting input terminal connected to said shield line, wherein an imaginary short state exists between said inverting input terminal and said non-inverting input terminal and wherein a signal having a value corresponding to an electrostatic capacitance of said sample to be measured is outputted when an AC signal is applied to said non-inverting input terminal, whereby any influence by a parasitic capacitance and fluctuation thereof within said shield box is almost removed.

It is noted here that the box is preferably a shielded box. Further, the box is not limited to be box-shaped and may be any container as long as the box can accommodate the prober. The predetermined conductive portion of the sample to be measured is preferably all the conductive portions other than an electrode to be measured at least at a certain moment, excluding an earth (ground) electrode. Actually, it is difficult to interconnect all of the conductive portions, and, therefore, the predetermined portion of the measured sample may be a probe card or another conductive portion connected to a probe, excluding the electrode to be measured, or may be all or a part of the conductive portions connectable via any possible means, other than the electrode to be measured.

An electrostatic capacitance is formed between at least two electrodes of the sample to be measured, and the detection terminal contacts with either one of the electrodes of the sample to be measured.

The shield line preferably surrounds the entire length of the signal line, except the detection terminal.

It is preferred that the probing and measurement system further comprises:

- a grounded signal line having one end being in contact with the other electrode of the sample to be measured, and the other end being grounded; and
- a shield line surrounding the grounded signal line, and electrically connected to the shield box.

The prober preferably comprises a manipulator for causing one end of the signal line and one end of the grounded signal line to be in contact with appropriate positions of the electrode and the sample to be measured. A predetermined conductive portion of the prober is placed at the same electric potential as the shield box.

The predetermined conductive portion of the prober means a part or all of the portions other than the detection terminal and the signal line therefor. The sample to be measured is, for example, a semiconductor wafer.

It is appreciated that the present invention is advantageous in that it is possible to obtain an output which depends merely upon a capacitance value of a measured electrostatic capacitor, without any influences by any parasitic capacitance considered to be formed between the signal line and the shield line surrounding thereof, such as a parasitic capacitance within the shield box and a fluctuation thereof, whereby a measured capacitance value can be detected with a high precision even if the capacitance value is microscopic.

The measurement result by the present invention has confirmed that measurement can be performed with a precision of several femtofarads. Further, in the case where a sample to be measured is a semiconductor wafer, various microscopic capacitances of the semiconductor wafer can be measured highly precisely, thereby enabling a high-performance inexpensive semiconductor device to be provided.

The above and other objects and advantages of the present invention will become apparent when reading the following description of the invention with reference to the accompanied drawings.

DETAILED DESCRIPTION OF THE INVENTION

Figure 3:
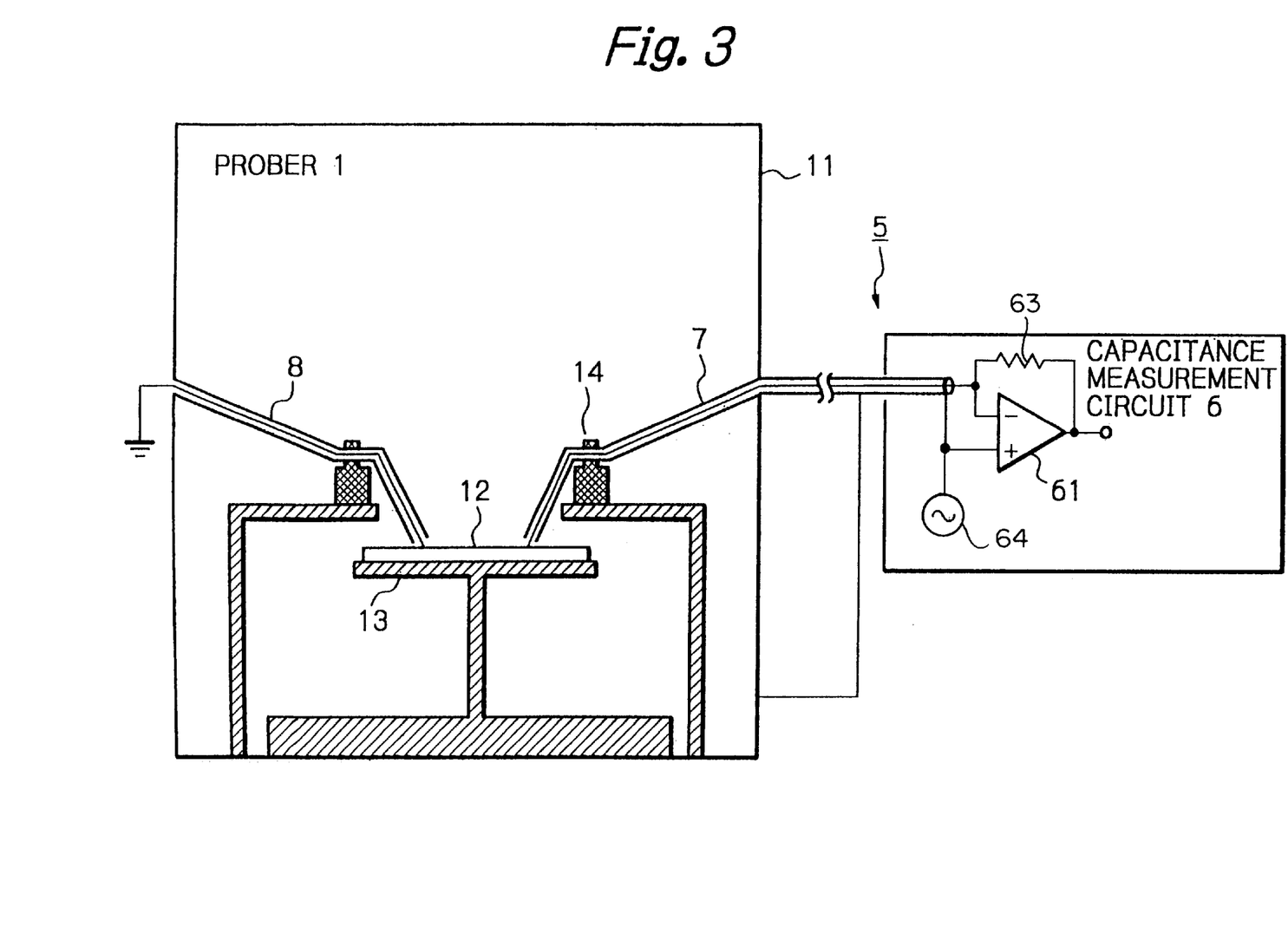
FIG. 3 schematically shows the structure of a probing and measurement system according to the present invention.

One embodiment of the present invention will be described hereinafter in detail with reference to FIGS. 3 to 5. FIG. 3 schematically showing the structure of a probing and measurement system according to the present invention, and FIG. 5 shows, in an enlarged manner, a portion including measured sample within the probing and measurement system shown in FIG. 3. It is noted that, in FIGS. 3 and 4, structural elements the same as or equivalent to the structural elements shown in FIGS. 1 and 2 are denoted with the same reference numerals, and description thereof is omitted hereafter.

Referring now to FIG. 3, a probing and measurement system according to the present invention includes a prober 1 and a capacitance measurement device 5. The prober 1 has the same structure as the one already described with reference to FIGS. 1 and 2, and comprises a shield box 1, a stage 13 and a manipulator 14. A sample to be measured which forms a capacitor 12 to be measured is placed on the stage 13. Conductive portions of the prober 1, such as the shield box 11, conductive portions of the stage 13, conductive portions of the manipulator 14 and a silicon substrate 121 of the sample, are electrically interconnected and placed at the same electric potential.

The capacitance measurement device 5 includes a capacitance measurement circuit 6 and a coaxial cable 7. The shield 71 of the coaxial cable 7 is electrically connected to the shield box 11 and extends close to the measured capacitor 12 in order to provide an electrical shield to the core 72 in such a manner that a tip of the core 72 is exposed only by a length of 100 microns or less. The exposed tip of the core 72 of the coaxial cable 7 serves as a detection terminal and is adjusted in position by the manipulator 14 so as to contact with an appropriate position of a first layer electrode 123. The diameter of a cross section of the tip of the core 72, i.e., the detection terminal is preferably 30 microns or less.

Another coaxial cable 8 is provided in order to ground a second layer electrode 125 opposing the first layer electrode 123 via a capacitive insulator 124,. As shown in FIG. 4, a tip portion of the core 82 of the coaxial cable 8 contacts with the second layer electrode 125, and the other end of the core 82 is grounded. The shield 81 of the coaxial cable 8 extends close to the measured capacitor 12 to expose only the tip of the core 82 by a length of 100 microns or less, and is electrically connected to the shield box 11. The manipulator 14 causes the exposed tip portion of the core 82 to be in contact with an appropriate position of the second layer electrode 125. The diameter of the exposed tip portion is preferably 30 microns or less.

The capacitance measurement circuit 6 is provided with an operational amplifier 61. The other end of the shield 71 of the coaxial cable 7 is connected to a non-inverting input terminal (+) of the operational amplifier 61, and the other end of the core 72 is connected to an inverting input terminal (−) of the operational amplifier 61. The structure and operation of the capacitance measurement circuit 6 will be described below with reference to FIG. 5.

In FIG. 5, an open loop gain of the operational amplifier 61 is so much larger, that is to say, being close to infinity. A feedback resistance 63 is connected between an output terminal 62 and the inverting input terminal (−) to apply a negative feedback to the operational amplifier 61. An AC signal generator 64 is connected to the non-inverting input terminal (+) of the operational amplifier 61. The shield 71 of the coaxial cable 7 operates to prevent a noise or another unnecessary signal from being introduced to the core 72 from the outside and is not grounded and is connected to the non-inverting input terminal (+) of the operational amplifier 61 as described above. As a result, the entire conductive portions of the prober 1, such as the shield box 11, the conductive portions of the stage 13, the conductive portions of the manipulator 14 and the silicon substrate 121, are short-circuited to the non-inverting input terminal (+) of the operational amplifier 61.

One end of the core 72 of the coaxial cable 7 is connected to the inverting input terminal (−) of the operational amplifier 61, and the other end of the core 72 contacts with the first layer electrode 123 which is one of the electrodes for forming the capacitor 12 to be measured. The second layer electrode 125, the other of the electrodes for forming the measured capacitor 12, is grounded via the core 82 of the coaxial cable 8.

Since the negative feedback is applied to the operational amplifier 61 via the feedback resistance 63 and the open loop gain of the operational amplifier 61 is so much larger, that is to say, being close to infinity, and the impedance of the operational amplifier 61 is so much higher, that is to say, being close to infinity, the operational amplifier 61 is in an imaginary short state. In other words, a voltage difference between the inverting input terminal (−) and the non-inverting input terminal (+) of the operational amplifier 61 is substantially zero. Consequently, the core 72 and the shield 71 are at the same electric potential, and any parasitic capacitance generated between the core 72 and the shield 71 can be canceled. This is true irrespective of the length of the core 72 and irrespective of such a matter that the core 72 is moved, folded and folded back.

Assume that an AC output voltage of the AC signal generator 64 is Vi and that an angular frequency of the alternating output voltage Vi is ω. Further, assume that an electrostatic capacitance of the capacitor 12 to be measured is Cx, that an electric current flowing through the measured capacitor 12 is $i_1$, that a resistance value of the feedback resistance 63 is Rf, that an electric current flowing through the feedback resistance 63 is $i_2$, that a voltage at the inverting input terminal (−) of the operational amplifier 61 is Vm, and that an output voltage of the operational amplifier 61 is Vo. Since the operational amplifier 61 is in the imaginary short state as described above, the voltage Vm at the inverting input terminal (−) is at the same electric potential as the AC signal output voltage Vi of the AC signal generator 64. In other words, the following equation is resulted:

$$Vi=Vm$$

Additionally, the following equations are obtained:

$$i_1=-Vm/(1/j\omega Cx)=-Vi/(1/j\omega Cx)$$

$$i_2=(Vm-Vo)/Rf=(Vi-Vo)/Rf$$

Since $i=i_2$, the output voltage Vo of the operational amplifier 61 is obtained as follows:

$$Vo=Vi(1+j\omega)Rf\cdot Cx$$

This equation indicates that the operational amplifier 61 outputs a voltage including an AC component proportional to the electrostatic capacitance Cx of the measured capacitor 12.

It should be noted here that any floating capacitance considered to be formed equivalently between the core 72 and the shield 71, such as any parasitic capacitance formed within the shield box 11, does not appear between the inverting input terminal (−) and the non-inverting input terminal (+) of the operational amplifier 61, since the operational amplifier 61 is in the imaginary short state. As a result, the output voltage Vo of the operational amplifier 61 does not at all include any term related with any parasitic capacitance generated between the core 72 and the shield 71. Consequently, the voltage Vo merely corresponding to a microscopic electrostatic capacitance Cx of the capacitor 12 to be measured is outputted from the operational amplifier 61, although the electrostatic capacitance Cx is such microscopic as of the order of fF (femtofarad, 1/1000 of a picofarad), By integrating the output voltage Vo, a DC voltage proportional to the electrostatic capacitance Cx of the capacitor 12 can be obtained. The electrostatic capacitance Cx can be obtained from a value of the DC voltage, the resistance value Rf of the feedback resistance 63 and an amount of the AC output voltage Vi. As described above, the output voltage Vo of the operational amplifier 61 does not include any term related with any parasitic capacitance generated between the core 72 and the shield 71, but includes a term corresponding to the electrostatic capacitance Cx of the capacitor 12 to be measured. Consequently, the electrostatic capacitance Cx can be detected with a high precision even if the electrostatic capacitance Cx is microscopic.

Figure 4:
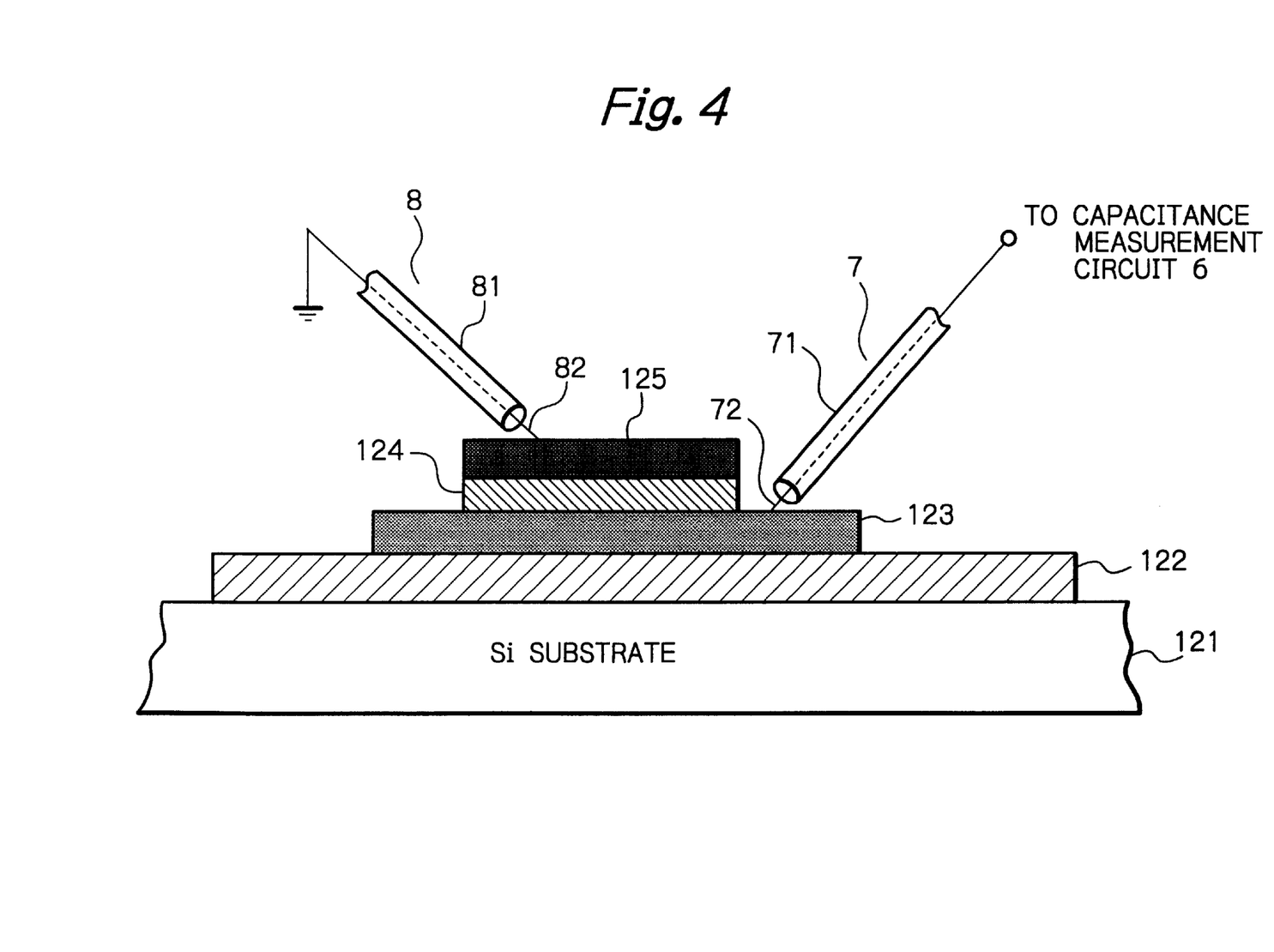
FIG. 4 shows, in an enlarged manner, a capacitor to be measured and the vicinity thereof in the probing and measurement system of FIG. 3.
Figure 5:
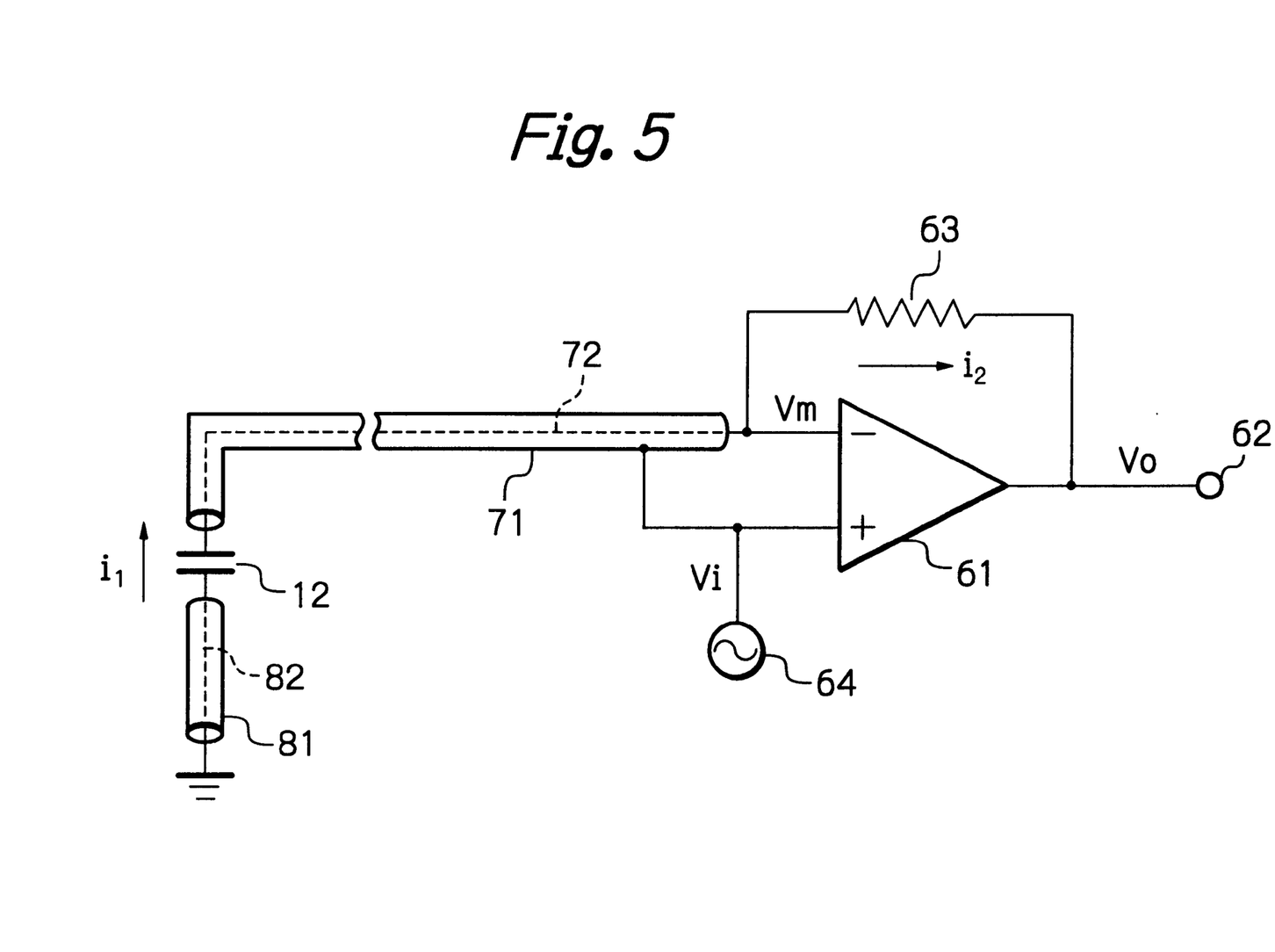
FIG. 5 schematically shows the structure of a capacitance measurement circuit of FIG. 3.

The first layer electrode 123 which is one of the electrodes forming the measured capacitor 12 shown in FIGS. 3 to 5 is formed on a silicon substrate. In this case, the probing and measurement system of FIG. 3 can be used for determining whether or not the sample to be measured is in order. To this end, an amount of the electrostatic capacitance generated between the first layer electrode 123 and the second layer electrode 125 is monitored, and, it is determined whether or not the sample to be measured is in order, by deciding whether or not a value of the electrostatic capacitance is a normal value. Also in this case, the output voltage Vo of the operational amplifier 61 does not contain any term related with any parasitic capacitance generated between the core 72 and the shield 71, but contains only a term corresponding to the measured electrostatic capacitance between the first layer electrode 123 and the second layer electrode 125. Consequently, the electrostatic capacitance can be detected with a high precision even if the electrostatic capacitance is microscopic, and it is possible to determine with a high precision whether or not the sample to be measured is in order. Specifically, a microscopic capacitance of respective portions within a semiconductor devices, such as a memory cell capacitor element of a DRAM, interconnect capacitance, a gate capacitance and a gate overlapping capacitance of a MOS transistor and a pn junction capacitance, can be measured, thereby providing highperformance inexpensive semiconductor devices.

Furthermore, the measured capacitor 12 of FIGS. 3 to 5 can be, for example, a capacitor of a capacitive sensor. One electrode of the capacitive sensor is connected to the inverting input terminal (−) of the operational amplifier 61 via the core 72, and the other electrode (or something equivalent thereto) is grounded, fixed to an appropriate bias potential, or opened to space without being grounded. The capacitive sensor in this context include a known capacitive sensor, such as an acceleration sensor, seismometer, pressure sensor, displacement sensor, displacement meter, proximity sensor, touch sensor, ion sensor, humidity sensor, raindrop sensor, snow sensor, thunder sensor, positioning sensor, contact defect sensor, shape sensor, end point detecting sensor, vibration sensor, ultrasonic sensor, angular speed sensor, liquid amount sensor, gas sensor, infrared ray sensor, ray sensor, water level meter, freeze sensor, moisture meter, vibration meter, charge sensor, printed substrate tester, as well as every device for detecting an electrostatic capacitance.

It is noted that the description has been made to use the coaxial cables 7, 8, but, instead, a cable connecting the first layer electrode 123 and the inverting input terminal of the operational amplifier 61, a cable for grounding the second layer electrode 125 and shield lines surrounding these cables can be used.

It can be said that advantages similar to the above described may be brought about if upper and lower probing pads connected through electrically conducting contact holes with the first layer electrode and the second layer electrode, respectively, are provided and the probe comes into contact with the upper pad in making a measurement.

The subject application is based on an application No. 226931/98 filed on Aug. 11, 1998 in Japan, the content of which is incorporated herewith by reference.

What is claimed is:

1. A probing and measurement system comprising:

a prober having a box in which a sample to be measured is to be disposed, and comprising a signal line having one end which serves as a detection terminal for contacting with said sample to be measured and having a shield surrounding said signal line;

a device placing at least one of a conductive portion of said box or a predetermined conductive portion of said sample to be measured and said shield at the same electric potential; and a capacitance measurement circuit comprising an operational amplifier which has an inverting input terminal connected to the other end of said signal line and a non-inverting input terminal connected to said shield, an AC signal applied to said non-inverting input terminal and said shield, wherein an imaginary short state exists between said inverting input terminal and said non-inverting input terminal and wherein said operational amplifier outputs a signal having a value corresponding to an electrostatic capacitance of said sample.

2. A probing and measurement system as claimed in claim 1, wherein said prober further comprises a manipulator for causing the one end of said signal line to contact with a portion of said sample to be measured, and a device for placing a predetermined conductive portion of the prober at the same electric potential as said box.

3. A probing and measurement system comprising:

a prober having a shield box in which a sample to be measured is disposed;

a signal line one end of which is a detection terminal for contacting with said sample to be measured;

a shield line surrounding said signal line; device for placing a conductive portion of said shield box, a conductive portion of said sample to be measured and said shield line at the same electric potential; and a capacitance measurement circuit having an operational amplifier which has an inverting input terminal connected to the other end of said signal line and a non-inverting input terminal connected to said shield line, wherein an imaginary short state exists between said inverting input terminal and said non-inverting input terminal, and wherein a signal having a value corresponding to an electrostatic capacitance of said sample to be measured is outputted when an AC signal is applied to said non-inverting input terminal.

4. A probing and measurement system as claimed in claim 1 or 3, wherein an electrostatic capacitance is formed between at least two electrodes of said sample to be measured, and wherein said detection terminal contacts with one of said electrodes of said sample to be measured.

5. A probing and measurement system as claimed in claim 1 or 3, wherein said shield line is a shield line surrounding the entire length of said signal line excluding said detection terminal.

6. A probing and measurement system as claimed in claim 4 or 5, further comprising:

a grounded signal line having one end which contacts with the other of said electrodes of said sample to be measured and the other end which is grounded; and a shield line surrounding said grounded signal line and electrically connected to said shield box.

7. A probing and measurement system as claimed in claim 3, wherein said prober further comprises a manipulator for causing the one end of said signal line and one end of said grounded signal line to contact with a portion of said electrodes of said sample to be measured, and device for placing a predetermined conductive portion of the prober at the same electric potential as said shield box.

8. A probing system comprising a probe for measuring a capacitance of a semiconductor device and a capacitance measurement circuit, wherein said probe comprises a signal line having at least one end which is a detection terminal for contacting with a sample to be measured, and a shield line surrounding said signal line, wherein said capacitance measurement circuit comprises an operational amplifier which has an inverting input terminal connected to the other end of said signal line and a non-inverting input terminal connected to said shield line, wherein an imaginary short state exists between said inverting input terminal and said non-inverting input terminal and wherein a signal having a value corresponding to an electrostatic capacitance of said sample to be measured is outputted when an AC signal is applied to said non-inverting input terminal.

* * * * *

UNITED STATES PATENT AND TRADEMARK OFFICE
CERTIFICATE OF CORRECTION

PATENT NO. : 6,348,809 B1
DATED : February 19, 2002
INVENTOR(S) : Yoshihiro Hirota et al.

It is certified that error appears in the above-identified patent and that said Letters Patent is hereby corrected as shown below:

Column 7,
Lines 44-52, are corrected to read
-- 3. A probing and measurement system comprising:
a prober having a shield box in which a sample to be measured is to be disposed;
a signal line one end of which is a detection terminal for contacting with said sample to be measured;
a shield line surrounding said signal line;
device for placing a conductive portion of said shield box, a conductive portion of said sample to be measured and said shield line at the same electric potential; and
a capacitance measurement circuit having an operational amplifier which has an inverting input terminal connected to the other end of said signal line and a non-inverting input terminal connected to said shield, an AC signal applied to said non-inverting input, and said shield line, wherein an imaginary short state exists between said inverting input terminal and said non-inverting input terminal, and wherein a signal having a value corresponding to an electrostatic capacitance of said sample to be measured is outputted. --

Column 8,
Lines 16-50, are corrected to read
-- 5. A probing and measurement system as claimed in claim 1 or 3, wherein said shield is a shield surrounding the entire length of said signal line excluding said detection terminal.

6. A probing and measurement system as claimed in claim 4 or 5, further comprising:
a grounded signal line having one end which contacts with the other of said electrodes of said sample to be measured and the other which is grounded; and
a shield surrounding said grounded signal line and electrically connected to said shield box.

7. A probing and measurement system as claimed in claim 6, wherein said prober further comprises a manipulator for causing the one end of said signal line and the one end of said grounded signal line to contact with a portion of said electrodes of said sample to be measured, and a device for placing a predetermined conductive portion of the prober at the same electric potential as said shield box.

UNITED STATES PATENT AND TRADEMARK OFFICE
CERTIFICATE OF CORRECTION

PATENT NO. : 6,348,809 B1
DATED : February 19, 2002
INVENTOR(S) : Yoshihiro Hirota et al.

It is certified that error appears in the above-identified patent and that said Letters Patent is hereby corrected as shown below:

8. A probing system comprising a probe for measuring a capacitance of a semiconductor device and a capacitance measurement circuit,
wherein said probe comprises a signal line having at least one end which is a detection terminal for contacting with a sample to be measured, and a shield surrounding said signal line,
wherein said capacitance measurement circuit comprises an operational amplifier which has an inverting input terminal connected to the other end of said signal line and a non-inverting input terminal connected to said shield, an AC signal applied to said non-inverting input terminal and said shield, wherein an imaginary short state exists between said inverting input terminal and said non-inverting input terminal an wherein a signal having a value corresponding to an electrostatic capacitance of said sample to be measured is outputted. --

Signed and Sealed this

Seventeenth Day of December, 2002

JAMES E. ROGAN
*Director of the United States Patent and Trademark Office*